United States Patent
Kaupp

(10) Patent No.: US 10,670,637 B2
(45) Date of Patent: Jun. 2, 2020

(54) CURRENT MEASURING CIRCUIT, BATTERY AND MOTOR VEHICLE

(71) Applicants: Robert Bosch GmbH, Stuttgart (DE); Samsung SDI Co., Ltd., Yongin-si, Gyeonggi-do (KR)

(72) Inventor: Patrick Kaupp, Stuttgart (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/997,790

(22) Filed: Jun. 5, 2018

(65) Prior Publication Data
US 2018/0284163 A1 Oct. 4, 2018

Related U.S. Application Data

(62) Division of application No. 14/362,121, filed as application No. PCT/EP2012/072713 on Nov. 15, 2012, now Pat. No. 10,018,657.

(30) Foreign Application Priority Data

Dec. 16, 2011 (DE) .................. 10 2011 088 893

(51) Int. Cl.
*G01R 19/00* (2006.01)
*G01R 31/382* (2019.01)
(Continued)

(52) U.S. Cl.
CPC ............ *G01R 19/00* (2013.01); *G01R 1/203* (2013.01); *G01R 15/20* (2013.01); *G01R 31/382* (2019.01); *G01R 33/07* (2013.01)

(58) Field of Classification Search
CPC ........ G01R 19/00; G01R 1/203; G01R 15/20; G01R 31/3606; G01R 33/07
See application file for complete search history.

(56) References Cited

U.S. PATENT DOCUMENTS 5,426,416 A * 6/1995 Jefferies ............... G01R 15/146
340/635
6,304,062 B1 * 10/2001 Batson ................... G01R 1/203
320/134
(Continued)

FOREIGN PATENT DOCUMENTS

DE 10 2009 046 564 A1 5/2011
EP 1 213 189 A1 6/2002

OTHER PUBLICATIONS

Measuring Current with IMC Hall Effect Technology, 2003 (Hall Effect Technology), available at: http://www.sensorsmag.com/sensors/electric-magnetic/measuring-current-with-imc-hall-effect-technology-786.*

(Continued)

*Primary Examiner* — Daniel R Miller
(74) *Attorney, Agent, or Firm* — Maginot, Moore & Beck LLP

(57) ABSTRACT

A current measuring circuit for redundantly measuring electrical current includes a measuring resistor, a magnetic field sensor, and an evaluation circuit on an evaluation circuit board. The evaluation circuit is used to determine electrical current using the measuring resistor. The magnetic field sensor on the evaluation circuit board and the evaluation circuit board are arranged in direct proximity to the measuring resistor such that the magnetic field sensor is configured to detect the magnetic field from the current-carrying resistor. A battery includes the current measuring circuit and a motor vehicle includes the battery.

9 Claims, 2 Drawing Sheets

(51) Int. Cl.
    *G01R 1/20*         (2006.01)
    *G01R 15/20*      (2006.01)
    *G01R 33/07*      (2006.01)

(56)             References Cited

U.S. PATENT DOCUMENTS

| | | | |
|---|---|---|---|
| 6,646,430 B1 * | 11/2003 | Skerritt | G01R 1/203 |
| | | | 324/126 |
| 7,319,304 B2 * | 1/2008 | Veloo | B60R 16/023 |
| | | | 320/134 |
| 2012/0262151 A1 | 10/2012 | Mandic et al. | |

OTHER PUBLICATIONS

How to Measure Current Using a Shunt Resistor, 2010 (Shunt Resistor), available at: http://www.measurementest.com/2010/08/how-to-measure-current-using-shunt.html.*
International Search Report corresponding to PCT Application No. PCT/EP2012/072713, dated Feb. 4, 2013 (German and English language document) (5 pages).

* cited by examiner

CURRENT MEASURING CIRCUIT, BATTERY AND MOTOR VEHICLE

CROSS-REFERENCE TO RELATED APPLICATIONS

This application is a division of U.S. application Ser. No. 14/362,121, filed on May 31, 2014, which is a 35 U.S.C. § 371 National Stage Application of PCT/EP2012/072713, filed on Nov. 15, 2012, which claims the benefit of priority to Serial No. DE 10 2011 088 893.4, filed on Dec. 16, 2011 in Germany, the disclosures of which are incorporated herein by reference in their entirety.

BACKGROUND

The present disclosure relates to a current-measuring circuit for redundantly measuring an electric current, having a measuring resistor, an evaluation circuit on an evaluation-circuit printed circuit board and a magnetic-field sensor.

The disclosure also relates to a battery having the current-measuring circuit according to the disclosure and to a motor vehicle having the battery according to the disclosure.

It would appear that, in future, new battery systems will be used both in stationary applications, such as wind turbines, in motor vehicles in the form of hybrid or electric motor vehicles, and in electronic devices, such as laptops or mobile telephones, with very stringent requirements being placed on said battery systems in respect of reliability, safety, performance and service life.

In vehicles with an at least partially electric drive, electrical energy stores are used in order to store the electrical energy for the electric motor which assists the drive or acts as drive. In vehicles of the most recent generation, in this case so-called lithium-ion batteries are used. These batteries are distinguished, inter alia, by high energy densities and an extremely low level of self-discharge. Lithium-ion cells have at least one positive and one negative electrode (cathode and anode, respectively) which can reversibly insert (intercalation) lithium ions (Li+) or extract (deintercalation) them again.

FIG. 1 shows how individual battery cells 10 can be assembled to give battery modules 12 and then batteries 14. This is performed by poles of the battery cells 10 being connected in parallel or series (not illustrated). In this case, by definition, a battery module 12 or a battery 14 comprises at least two battery cells 10, wherein the terms battery 14 and battery module 12 are often used synonymously. The electric voltage of a battery 14 is, for example, between 120 and 600 volts DC.

In the case of batteries for automobile drive technology (traction batteries), there is a need, to determine the state of charge and for reasons of safety, to measure the current supplied to and discharged from the battery cells. Therefore, the functionality of the current sensor must be known and hence be detectable by means of suitable measures. In many cases, the current is detected using current sensors which operate on the basis of the resistor principle (shunt). In order to keep the power loss in the shunt resistor to a minimum, the resistance value thereof is selected to be much smaller than that of the load. The small voltage drops arising therefrom must therefore be amplified for evaluation by means of electronic circuits connected downstream and evaluated. If the connection between resistor and evaluation circuit is interrupted, or if the resistor or the circuit has another fault, this cannot be readily unambiguously ascertained.

DE 10 2009 046 564 A1 discloses a battery system having a high-voltage system and a low-voltage system. The high-voltage system comprises a battery module, while the low-voltage system comprises a battery control unit (BCU). Cell-monitoring units are assigned to the battery cells and measure the voltages of the battery cells. Furthermore, the document discloses a redundant current measurement by means of a measuring resistor (shunt) and a Hall sensor.

The disclosure provides a current-measuring circuit for redundantly measuring an electric current, having a measuring resistor, a magnetic-field sensor and an evaluation circuit on an evaluation-circuit printed circuit board. The evaluation circuit is designed to determine the electric current using the measuring resistor. The magnetic-field sensor on the evaluation-circuit printed circuit board and the evaluation-circuit printed circuit board are characteristically arranged in the immediate vicinity of the measuring resistor, with the result that the magnetic-field sensor can detect the magnetic field of the measuring resistor when current flows through it.

The disclosure is based on the discovery that, by integration of the magnetic-field sensor on the evaluation-circuit printed circuit board, for example in the context of a placement option, a particularly compact and inexpensive redundant current-measuring circuit in one unit is made possible, which current-measuring circuit is based on two different measurement principles. This is made possible by virtue of the fact that the magnetic-field sensor detects that magnetic field which builds up around the measuring resistor owing to the flow of current in the measuring resistor.

When selecting the measuring resistor, it is advisable to use a measuring resistor—also called shunt—which is as small as possible. Preferably, measuring resistors with an electrical resistance of less than 1 mΩ are possible, in order to keep the losses caused by the measuring resistor to a minimum. The use of a small measuring resistor means that even only small voltage drops can be measured across said measuring resistor during operation though. Said small voltage drops are, as usual, amplified and evaluated using the evaluation circuit and are used as a measure for the current flowing through the measuring resistor. Owing to the relatively high accuracy of such circuits, the signal obtained therefrom is used as primary signal for precise determination of the current flowing through the measuring resistor.

In addition to the evaluation circuit, the magnetic-field sensor is arranged on the evaluation-circuit printed circuit board and is designed to measure a magnetic field around the measuring resistor, which magnetic field is proportional to the flow of current; the magnetic-field sensor is preferably embodied as a Hall sensor. The secondary signal output by the magnetic-field sensor in turn corresponds to the current flowing through the measuring resistor, which current is thus redundantly calculated on the basis of a second independent measurement principle.

According to an advantageous configuration of the disclosure, the evaluation circuit is also designed to compare the primary signal corresponding to the current determined by means of the measuring resistor with the secondary signal corresponding to the current determined by means of the magnetic-field sensor and to output an error signal in the event that the two signals differ. This can be achieved by integrating a few additional components, for example, evaluation components, on the evaluation-circuit printed circuit board. The primary signal, which is determined via the measuring resistor and the evaluation circuit, generally allows more precise conclusions to be drawn in relation to the flow of current than the secondary signal of the magnetic-field sensor. However, should the primary signal suddenly differ significantly from the secondary signal of the magnetic-field sensor, the error signal is output, as a result of which a fault in the current-measuring circuit can be identified.

So that the magnetic-field sensor can be operated in an optimum manner, said magnetic-field sensor is arranged in the immediate vicinity of the measuring resistor. The normal distance between the magnetic-field sensor and the measuring resistor is preferably less than 10 mm, in particular less than or equal to ($\leq$) 5 mm. The smaller the normal distance, the better the interference immunity with respect to external interfering magnetic fields.

It is further preferred that the evaluation-circuit printed circuit board having the magnetic-field sensor lies flat against the measuring resistor. In this case, it may be necessary to electrically isolate the evaluation-circuit printed circuit board from the measuring resistor, apart from two electrically conductive connections thereto. The voltage drop across the measuring resistor can be measured by means of the two electrically conductive connections to the measuring resistor.

Furthermore, a battery having a current-measuring circuit is provided. The current-measuring circuit is used, for example, to measure currents within the battery.

The battery is preferably a lithium-ion battery. Owing to the use of lithium-ion technology by means of a plurality of lithium-ion secondary cells, particularly high energy store densities can be achieved, which leads to further advantages, in particular in the field of electromobility.

Furthermore, a motor vehicle having the battery according to the disclosure is provided. The battery is generally used to supply energy to the drive of the motor vehicle. The battery according to the disclosure can also advantageously be used in an electrical device.

Advantageous developments of the disclosure are specified in the dependent claims and can be gleaned from the description.

BRIEF DESCRIPTION OF THE DRAWINGS

Exemplary embodiments of the disclosure are explained in more detail on the basis of the drawings and the following description. In the drawings.

DETAILED DESCRIPTION

Figure 1:
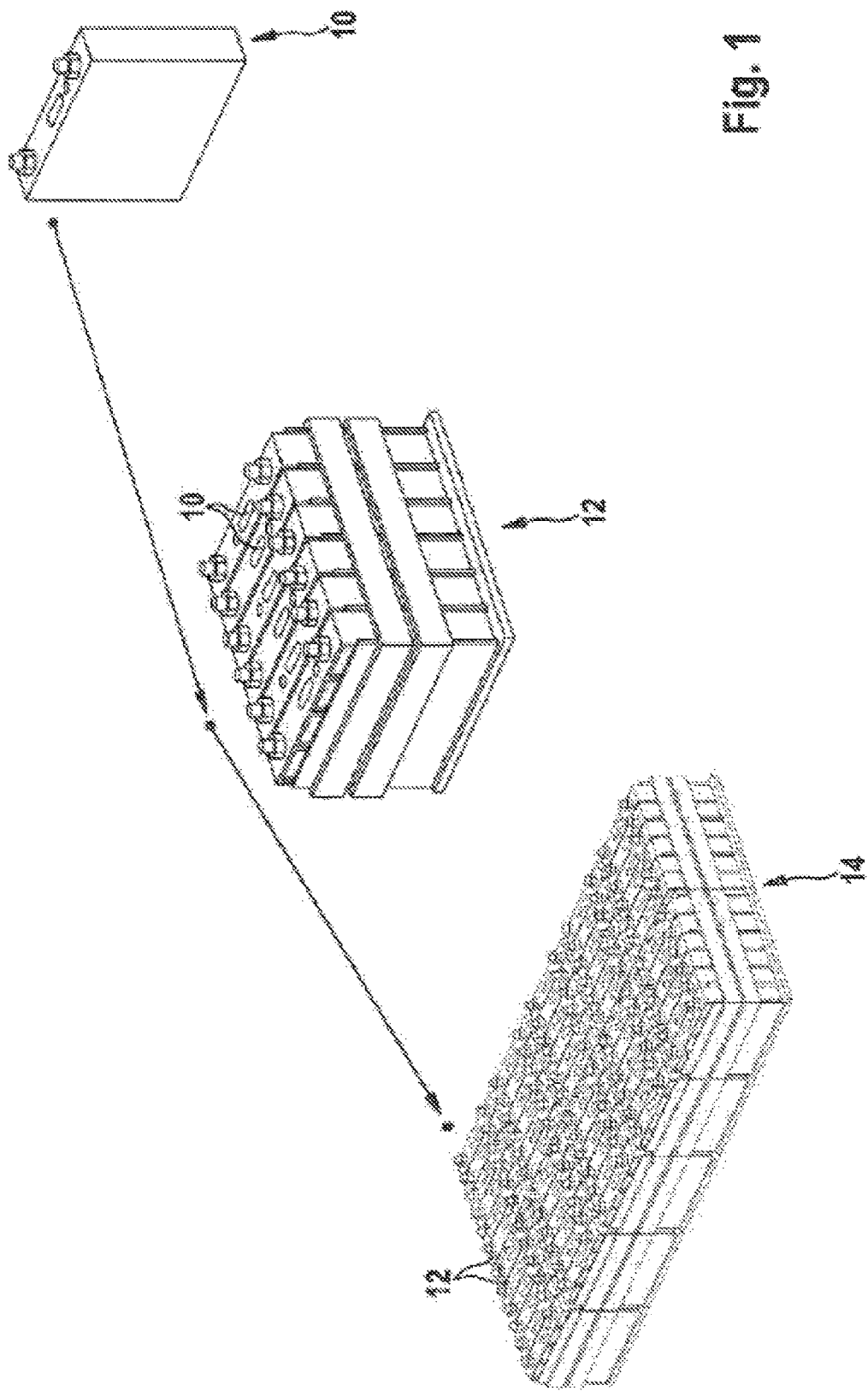
FIG. 1 shows a battery cell, a module and a battery.

FIG. 1 has already been discussed in order to explain the prior art.

Figure 2:
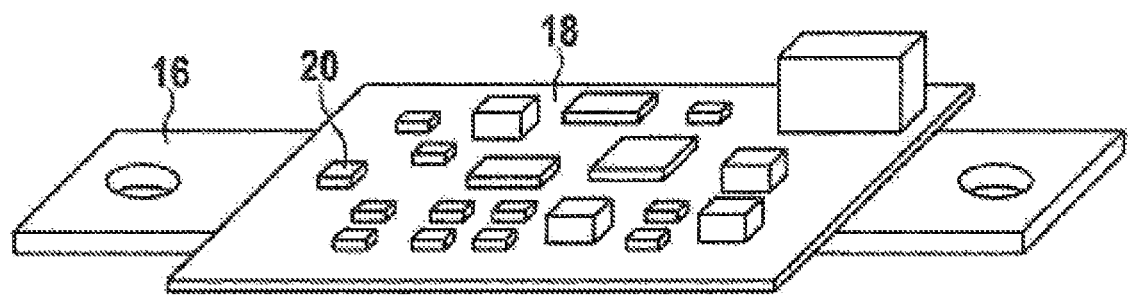
FIG. 2 shows a current-measuring circuit according to the disclosure.

FIG. 2 shows a current-measuring circuit according to the disclosure, having a measuring resistor 16 with connections which are depicted on the left and right in the figure. In addition to the components of the evaluation circuit, a magnetic-field sensor 20, for example a Hall sensor, is also arranged on the evaluation-circuit printed circuit board 18. In order to achieve an arrangement which is as compact as possible and optimum operating conditions for the magnetic-field sensor 20, the evaluation-circuit printed circuit board 18 can lie flat against the measuring resistor 16. An electrical isolator can then be arranged between the evaluation-circuit printed circuit board 18 and the measuring resistor 16 in order to electrically isolate the two; however, the evaluation circuit is connected to the measuring resistor 16 via two electrically conductive connections which are not illustrated.

The evaluation circuit can measure a voltage drop across the measuring resistor 16 by means of said two electrically conductive connections when an electric current flows through the measuring resistor 16. The evaluation circuit amplifies said signal, which is used as primary signal for precise determination of the electric current.

A magnetic-field sensor 20 is arranged on the evaluation-circuit printed circuit board 18, which magnetic-field sensor is used for redundant measurement, by means of an independent measurement principle, of the current flowing through the measuring resistor 16. Said magnetic-field sensor detects the magnetic field of the measuring resistor 16, which magnetic field is proportional to the flow of current through the measuring resistor 16, and supplies a secondary signal for determining the electric current.

In addition to its function of amplifying the measured voltage drop across the measuring resistor 16, the evaluation circuit can be designed to compare the secondary signal of the magnetic-field sensor 20 with the primary signal of the measuring resistor 16. In the event that the primary signal differs from the secondary signal, an error signal is output, as a result of which a malfunction of the current-measuring circuit can be assumed.

What is claimed is:

1. A current-measuring circuit for redundantly measuring an electric current, comprising:
   a measuring resistor having a first end comprising a first connector and a second end comprising a second connector, the first connector and the second connector being configured to connect the measuring resistor in series with a current carrying line;
   an evaluation-circuit printed circuit board that lies flat against the measuring resistor, the evaluation-circuit printed circuit board including a magnetic-field sensor and an evaluation circuit,
   wherein the evaluation circuit is electrically connected to the measuring resistor and is configured to measure a voltage drop across the measuring resistor when the electric current flows therethrough and determine a first value for the electric current flowing through the measuring resistor based on the measured voltage drop, and
   wherein the magnetic-field sensor is arranged on the evaluation-circuit printed circuit board in position to detect a magnetic field generated around the measuring resistor when the electric current flows through the measuring resistor, the evaluation circuit being configured to determine a second value for the electric current flowing through the measuring resistor based on the measured magnetic field.

2. The current-measuring circuit as claimed in claim 1, wherein the evaluation circuit is further configured to compare the first value for the electric current to the second value for the electric current and to output an error signal in the event that the first value and the second value differ.

3. The current-measuring circuit as claimed in claim 1, wherein a distance between the magnetic-field sensor and the measuring resistor is less than 10 mm.

4. The current-measuring circuit as claimed in claim 3, wherein the distance between the magnetic-field sensor and the measuring resistor is less than or equal to 5 mm.

5. The current-measuring circuit as claimed in claim 1, wherein the measuring resistor has an electrical resistance of less than 1 m$\Omega$.

6. The current-measuring circuit as claimed in claim 1, wherein the magnetic-field sensor is a Hall sensor.

7. A battery, comprising:
  at least one battery cell; and
  a current-measuring circuit configured to redundantly measure an electrical current output by the at least one battery cell, the current-measuring circuit including:
    a measuring resistor having a first end comprising a first connector and a second end comprising a second connector, the first connector and the second connector being configured to connect the measuring resistor in series with a current carrying line; and
    an evaluation-circuit printed circuit board that lies flat against the measuring resistor, the evaluation-circuit printed circuit board including a magnetic-field sensor and an evaluation circuit,
  wherein the evaluation circuit is electrically connected to the measuring resistor and is configured to measure a voltage drop across the measuring resistor when the electric current flows therethrough and determine a first value for the electric current flowing through the measuring resistor based on the measured voltage drop, and
  wherein the magnetic-field sensor is arranged on the evaluation-circuit printed circuit board in position to detect a magnetic field generated around the measuring resistor when the electric current flows through the measuring resistor, the evaluation circuit being configured to determine a second value for the electric current flowing through the measuring resistor based on the measured magnetic field.

8. The battery as claimed in claim 7, wherein the at least one battery cell is a lithium-ion battery cell.

9. A motor vehicle or electrical device, comprising:
  a battery including a current-measuring circuit configured to redundantly measure an electrical current, the current-measuring circuit including:
    a measuring resistor having a first end comprising a first connector and a second end comprising a second connector, the first connector and the second connector being configured to connect the measuring resistor in series with a current carrying line;
    an evaluation-circuit printed circuit board that lies flat against the measuring resistor, the evaluation-circuit printed circuit board including a magnetic-field sensor and an evaluation circuit,
  wherein the evaluation circuit is electrically connected to the measuring resistor and is configured to measure a voltage drop across the measuring resistor when the electric current flows therethrough and determine a first value for the electric current flowing through the measuring resistor based on the measured voltage drop, and
  wherein the magnetic-field sensor is arranged on the evaluation-circuit printed circuit board in position to detect a magnetic field generated around the measuring resistor when the electric current flows through the measuring resistor, the evaluation circuit being configured to determine a second value for the electric current flowing through the measuring resistor based on the measured magnetic field.

\* \* \* \* \*